United States Patent
Ichikawa

(10) Patent No.: US 8,227,868 B2
(45) Date of Patent: Jul. 24, 2012

(54) SEMICONDUCTOR DEVICE HAVING A PLURALITY OF SPACED-APART FIELD PLATES FORMED ON A FIELD INSULATING FILM

(75) Inventor: Daisuke Ichikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 16 days.

(21) Appl. No.: 12/929,540

(22) Filed: Jan. 31, 2011

(65) Prior Publication Data
US 2011/0186928 A1 Aug. 4, 2011

(30) Foreign Application Priority Data

Feb. 3, 2010 (JP) ................................ 2010-022117

(51) Int. Cl.
*H01L 29/78* (2006.01)
(52) U.S. Cl. ........ 257/367; 257/347; 257/401; 257/492; 257/493; 257/E29.009
(58) Field of Classification Search .................. 257/367, 257/347, 401, 492, 493, E29.009
See application file for complete search history.

(56) References Cited

U.S. PATENT DOCUMENTS

| | | | |
|---|---|---|---|
| 6,190,948 B1 * | 2/2001 | Seok | 438/140 |
| 6,307,232 B1 | 10/2001 | Akiyama et al. | |
| 7,592,668 B2 * | 9/2009 | Kocon | 257/335 |
| 7,675,120 B2 * | 3/2010 | Sekiguchi et al. | 257/372 |
| 2010/0230745 A1 * | 9/2010 | Saito et al. | 257/329 |
| 2010/0314706 A1 * | 12/2010 | Hullinger et al. | 257/466 |

FOREIGN PATENT DOCUMENTS

JP 10-341018 A 12/1998

* cited by examiner

*Primary Examiner* — Eugene Lee
(74) *Attorney, Agent, or Firm* — Rabin & Berdo, P.C.

(57) ABSTRACT

A semiconductor device according to the present invention includes a semiconductor substrate of a first conductivity type having a top surface and a rear surface, a semiconductor layer of a second conductivity type formed on the top surface of the semiconductor substrate, having a top surface and a rear surface, and having the rear surface in contact with the top surface of the semiconductor substrate, a body region of the first conductivity type formed in a top layer portion of the semiconductor layer, a first impurity region of the second conductivity type formed in a top layer portion of the semiconductor layer and spaced apart from the body region, a second impurity region of the second conductivity type formed in a top layer portion of the body region and spaced apart from a peripheral edge of the body region, a gate electrode formed on the semiconductor layer and opposed to a portion between the peripheral edge of the body region and a peripheral edge of the second impurity region, a field insulating film formed in a portion of the top surface of the semiconductor layer between the body region and the first impurity region, and a plurality of field plates formed on the field insulating film and spaced apart from each other, and a spacing between adjacent field plates decreases as the body region is approached from the first impurity region.

15 Claims, 4 Drawing Sheets

SOURCE SIDE　　　　　　　　　DRAIN SIDE

_US 8,227,868 B2_

SEMICONDUCTOR DEVICE HAVING A PLURALITY OF SPACED-APART FIELD PLATES FORMED ON A FIELD INSULATING FILM

BACKGROUND OF THE INVENTION

1. Field of the Invention

The present invention relates to a semiconductor device.

2. Description of Related Art

A semiconductor device according to a prior art is disclosed, for example, in Patent Document 1 (Japanese Published Unexamined Patent Application No. Hei 10-341018).

The semiconductor device disclosed in FIG. 1 of Patent Document 1 includes a thick-film SOI (silicon on insulator) substrate. The thick-film SOI substrate has a structure where an $n^-$-type semiconductor layer is laminated on a semiconductor substrate (silicon substrate) via an embedded insulation layer. A diode is formed in the $n^-$-type semiconductor layer.

The diode has an $n^+$ semiconductor region and a $p^+$ semiconductor region. A region of the $n^-$-type semiconductor layer is used as an $n^-$ drift region that forms a pn junction with the $p^+$ semiconductor region.

A cathode electrode is formed so as to be electrically connected to the $n^+$ semiconductor region. Also, an anode electrode is formed so as to be electrically connected to the $p^+$ semiconductor region.

An insulation layer provided on the $n^-$ semiconductor layer electrically isolates the cathode electrode and the anode electrode from other portions.

Also, capacitance-coupled multiple field plates, arranged from a plurality of conductive layers, are formed on the insulation layer between the cathode electrode and the anode electrode. The plurality of conductive layers are respectively insulated by the insulation layer and are respectively formed in a floating state (insular state). Also, a rear surface electrode is formed on a rear surface of the semiconductor substrate.

SUMMARY OF THE INVENTION

The thick-film SOI substrate is used in such a semiconductor device that includes a diode or a power MOSFET. However, the thick-film SOI substrate has a price of approximately several tens of thousands of yen per wafer, and the semiconductor device that uses the thick-film SOI substrate thus has a problem of being high in cost.

An object of the present invention is to provide a semiconductor device that enables reduction in cost.

The above and further objects, characteristics, and effects of the present invention shall be made clear by the following description of the preferred embodiment made with reference to the attached drawings.

DETAILED DESCRIPTION OF PREFERRED EMBODIMENTS

Figure 1:
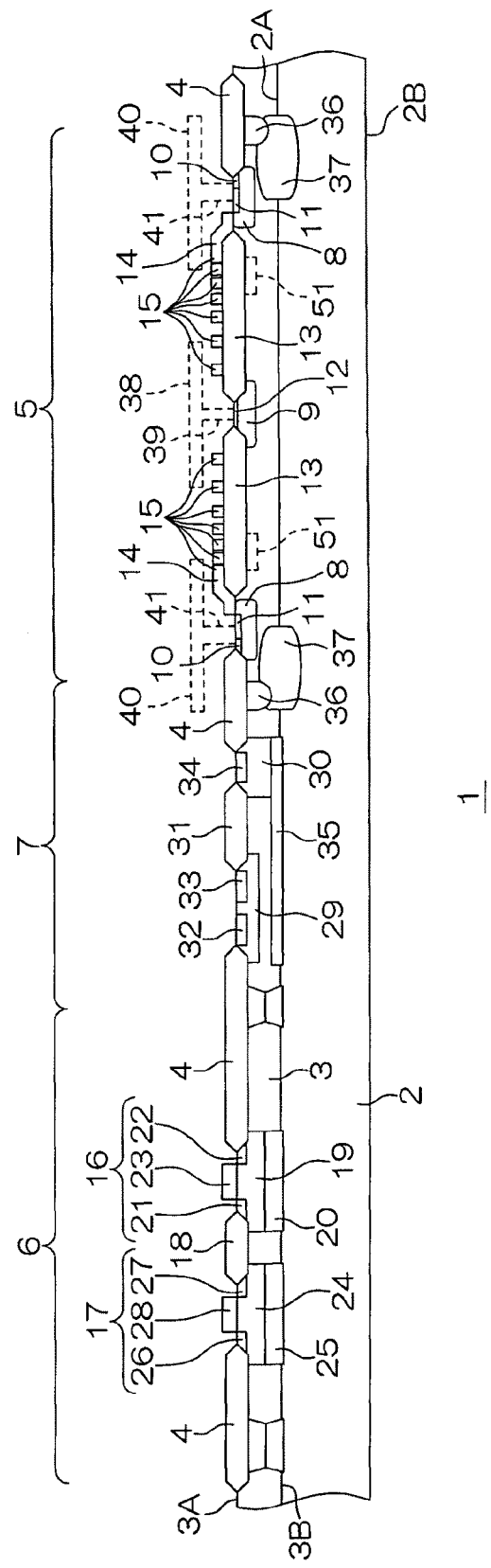
FIG. 1 is a schematic sectional view of a semiconductor device according to a preferred embodiment of the present invention.

A semiconductor device according to one aspect of the present invention includes a semiconductor substrate of a first conductivity type having a top surface and a rear surface, a semiconductor layer of a second conductivity type formed on the top surface of the semiconductor substrate, having a top surface and a rear surface, and having the rear surface in contact with the top surface of the semiconductor substrate, a body region of the first conductivity type formed in a top layer portion of the semiconductor layer, a first impurity region of the second conductivity type formed in a top layer portion of the semiconductor layer and spaced apart from the body region, a second impurity region of the second conductivity type formed in a top layer portion of the body region and spaced apart from a peripheral edge of the body region, a gate electrode formed on the semiconductor layer and opposed to a portion between the peripheral edge of the body region and a peripheral edge of the second impurity region, a field insulating film formed in a portion of the top surface of the semiconductor layer between the body region and the first impurity region, and no less than three field plates formed on the field insulating film and spaced apart from each other.

With the present semiconductor device, the semiconductor layer of the second conductivity type is formed on the semiconductor substrate of the first conductivity type and in contact with the semiconductor substrate. The semiconductor device includes an LDMOSFET that includes the body region, the first impurity region, and the second impurity region formed in the semiconductor layer, and the gate electrode formed on the semiconductor layer. That is, the semiconductor device according to the present invention, although including the LDMOSFET, adopts not a thick-film SOI substrate but the semiconductor substrate of the first conductivity type with the semiconductor layer of the second conductivity type provided directly above.

The semiconductor substrate made of a single layer has a price of approximately several thousand yen per wafer and is far less expensive than the thick-film SOI substrate. The semiconductor layer can be formed inexpensively and easily, for example, by an epitaxial growth method. Thus, with the semiconductor device according to the present invention, cost reduction can be achieved in comparison to a semiconductor device adopting a thick-film SOI substrate.

In a process of arriving at the present invention, the present inventor found that a device breakdown voltage of the LDMOSFET can be increased by increasing a specific resistance of the semiconductor layer. However, it was found that when the specific resistance of the semiconductor layer is increased, an electric field concentration occurs at a portion of the semiconductor layer close to the second impurity region when a high voltage is applied across the first impurity region and the second impurity region and that a leakage occurs due to the electric field concentration.

Thus, with the semiconductor device according to the present invention, no less than three field plates are provided on the field insulating film, and a spacing between the field plates is decreased as the body region is approached (as the second impurity region is approached) from the first impurity region. A capacitance of a capacitor arranged from mutually adjacent field plates thus increases as the body region is approached. Consequently, the concentration of electric field at the portion close to the second impurity region of the semiconductor layer can be suppressed and the occurrence of leakage due to the electric field concentration can be suppressed.

The plurality of field plates may include a plurality of annular plates that differ mutually in length and the plurality of annular plates are preferably disposed so that a relatively long annular plate surrounds a relatively short annular plate. In this case, the gate electrode is preferably formed to an annular shape that is integral to an outermost annular plate.

A RESURF layer of the first conductivity type may be formed in a portion of a top layer portion of the semiconductor layer opposed to the field insulating film. The concentration of electric field in the semiconductor layer can thereby be suppressed further.

The RESURF layer may be formed partially across the portion of the semiconductor layer where the concentration of electric field occurs readily or may be formed across an entirety of the portion opposed to the field insulating film. When, in the case where the RESURF layer is formed across the entirety of the portion opposed to the field insulating film, a concentration of the first conductivity type impurity in the RESURF layer is increased, although the device breakdown voltage of the LDMOSFET improves, an on resistance also increases. The concentration of the first conductivity type impurity in the RESURF layer should thus be determined in consideration of a balance between the device breakdown voltage and the on resistance.

An element isolating portion may be formed in the top surface of the semiconductor layer and an LDMOS region, in which the body region and the first impurity region are formed, may be insulatingly isolated from a region peripheral to the LDMOS region by the element isolating portion.

In this case, a bipolar transistor may be formed in the region that is insulatingly isolated from the LDMOS region by the element isolating portion.

The bipolar transistor may have a base region of the first conductivity type and a collector region of the second conductivity type formed in a top layer portion of the semiconductor layer and spaced apart from each other and an emitter region of the second conductivity type formed in a top layer portion of the base region. In this case, the semiconductor layer preferably includes a third impurity region of the second conductivity type formed on the rear surface side of the semiconductor layer with respect to the base region and the collector region and having a higher impurity concentration than the emitter region.

Preferably, the third impurity region is formed across the semiconductor substrate and the semiconductor layer, is connected to a deepest portion of the collector region, and extends along an interface of the semiconductor substrate and the semiconductor layer to a position opposed to the base region.

Also, a low isolation region of the first conductivity type may be formed across the semiconductor substrate and the semiconductor layer between a position opposed to the element isolating portion and a position opposed to the body region. By the forming of the low isolation region, the concentration of electric field below the body region can be prevented and further improvement of the device breakdown voltage can be achieved.

Also, in a case where the body region is formed to an annular shape and the first impurity region is formed in a region surrounded by the annular body region, the field insulating film may be formed to an annular shape, an inner peripheral edge thereof may be disposed on a peripheral edge of the first impurity region, and an outer peripheral edge thereof may be disposed at a position spaced apart from the body region.

Also, the semiconductor substrate may be made from a silicon substrate. Also, the specific resistance of the semiconductor layer is, for example, 2.5Ω·cm. Also, the element isolating portion may be made from a silicon oxide film.

A preferred embodiment of the present invention shall now be described specifically with reference to the attached drawings.

Figure 2:
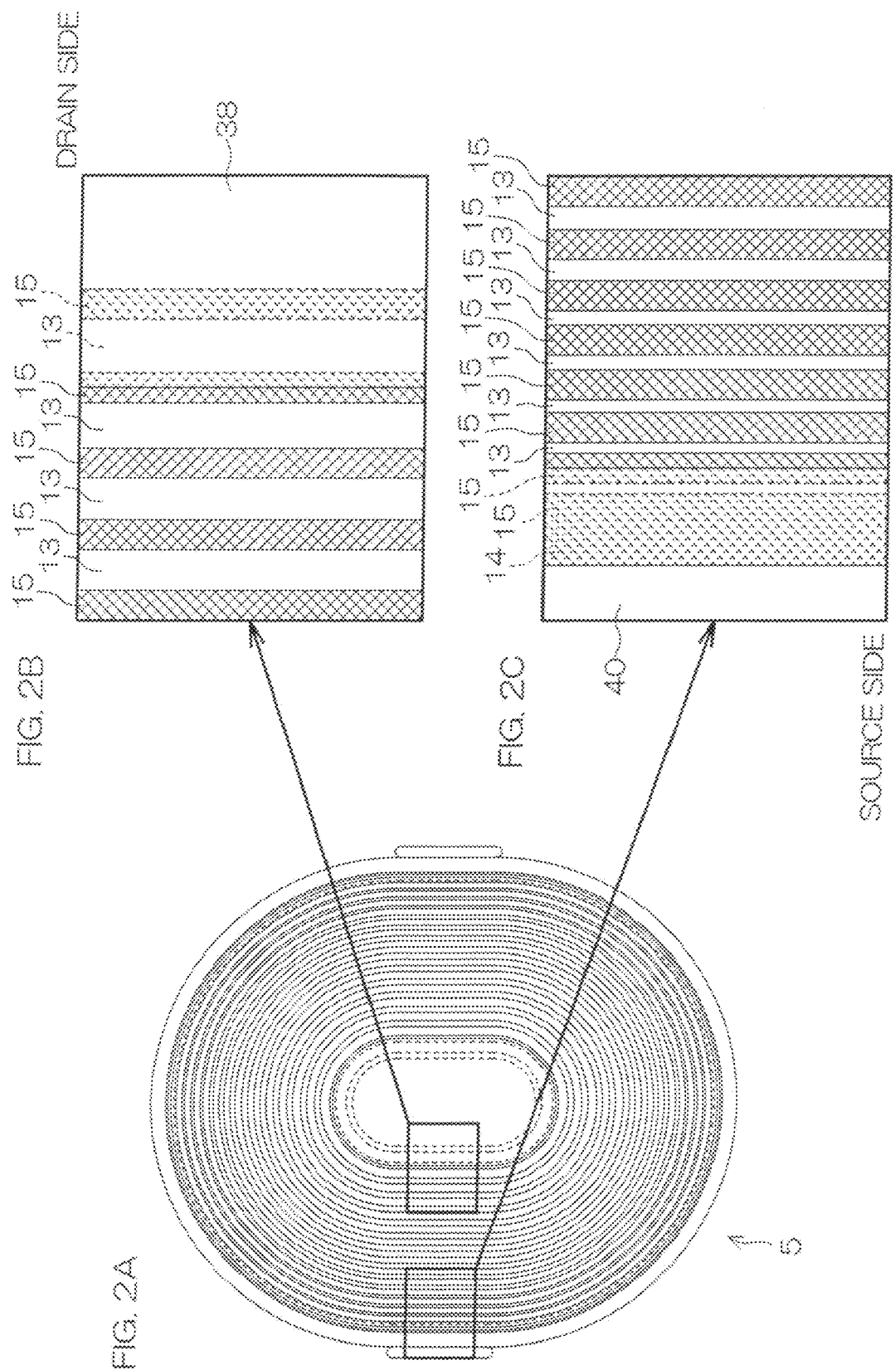
FIG. 2A is a schematic plan view of an LDMOS region of FIG. 1 and is an overall view.
FIG. 2B is a schematic plan view of the LDMOS region of FIG. 1 and is an enlarged view of a principal portion at a drain side.
FIG. 2C is a schematic plan view of the LDMOS region of FIG. 1 and is an enlarged view of a principal portion at a source side.

FIG. 1 is a schematic sectional view of a semiconductor device according to the preferred embodiment of the present invention. FIG. 2A to FIG. 2C are schematic plan views of an LDMOS region of FIG. 1, with FIG. 2A being an overall view, FIG. 2B being an enlarged view of a principal portion at a drain side, and FIG. 2C being an enlarged view of a principal portion at a source side. In FIG. 1, hatching of respective portions is omitted for the sake of simplification of illustration.

The semiconductor device 1 includes a p-type (first conductivity type) semiconductor substrate 2 having a top surface 2A and a rear surface 2B. The semiconductor substrate 2 is made, for example, from a silicon substrate. A specific resistance of the semiconductor substrate 2 is 270Ω·cm.

An n-type (second conductivity type) semiconductor layer 3 is laminated on the top surface 2A of the semiconductor substrate 2. A specific resistance of the semiconductor layer 3 is 2.50Ω·cm. The semiconductor layer 3 is formed, for example, by an epitaxial growth method and has a rear surface 3B, which is in contact with the top surface 2A of the semiconductor substrate 2, and a top surface 3A at the opposite side.

A LOCOS film 4 that is a silicon oxide film formed by a LOCOS (local oxidation of silicon) method and serves as an element isolating portion is formed in the top surface 3A of the semiconductor layer 3. By the LOCOS film 4, an LDMOS region 5, a CMOS region 6, and a Bi region 7 are each surrounded individually and insulatingly isolated from each other.

In the LDMOS region 5, a p-type body region 8 and an n-type drain buffer region 9 are formed in a top layer portion of the semiconductor layer 3.

The body region 8 is formed to an annular shape in plan view. In a top layer portion of the body region 8, an n-type source region 11 and a p-type body contact region 10 are formed mutually adjacently. The body contact region 10 is formed at an outer peripheral side of the body region 8, and the source region 11 and an inner peripheral edge of the body region 8 are spaced apart. A p-type impurity concentration of the body contact region 10 is higher than a p-type impurity concentration of the body region 8.

The drain buffer region 9 is formed at a central portion of a region surrounded by the body region 8 and is spaced apart from the body region 8. In a top layer portion of the drain buffer region 9, an n-type drain contact region 12 having a higher n-type impurity concentration than the drain buffer region 9 is formed at a central portion of the drain buffer region 9 in plan view.

In the top surface 3A of the semiconductor layer 3, an annular field insulating film 13 is formed in a portion between the body region 8 and the drain contact region 12. An inner peripheral edge of the field insulating film 13 is disposed along a peripheral edge of the drain contact region 12, and outer peripheral edge of the field insulating film 13 is disposed at a position spaced apart from the body region 8. The field insulating film 13 is formed by the same process as the LOCOS film 4.

Also, in the top surface 3A of the semiconductor layer 3, an unillustrated gate insulating film is formed across the body contact region 10 and the field insulating film 13.

A gate electrode 14 is formed on the gate insulating film. The gate electrode 14 is made of polysilicon doped with an impurity.

An LDMOSFET made up of the body region 8, the drain buffer region 9, the source region 11, the gate electrode 14, etc., is thereby provided in the LDMOS region 5.

At least three (seven in the present preferred embodiment) field plates 15 are formed on the field insulating film 13. Each field plate 15 is made of the same material as the gate electrode 14. The field plates 15 have mutually similar (but differing in circumferential length) annular shapes along the field insulating film 13 and are spaced apart mutually in a manner such that a relatively long field plate 15 surrounds a relatively short field plate 15. The gate electrode 14 surmounts the field insulating layer 13 and an outermost field plate 15 is formed integral to the gate electrode 14.

In the CMOS region 6, a LOCOS film 18 for insulatingly isolating an NMOS region 16 and a PMOS region 17 from each other is formed in the top surface 3A of the semiconductor layer 3. The LOCOS film 18 is formed by the same process as the LOCOS film 4 and the field insulating film 13.

In the NMOS region 16, a p-type P well region 19 is formed in a top layer portion of the semiconductor layer 3. Also, a p-type high concentration impurity region 20 having a higher p-type impurity concentration than the P well region 19 is formed below the P well region 19. The high concentration impurity region 20 has substantially the same size as the P well region 19 in plan view and is formed across the semiconductor substrate 2 and the semiconductor layer 3.

An n-type source region 21 and an n-type drain region 22 are formed in a top layer portion of the P well region 19 and are spaced apart from each other.

A region between the source region 21 and the drain region 22 is a channel region, and on a top surface of the channel region, a gate electrode 23 is formed across an unillustrated gate insulating film. The gate electrode 23 is made of the same material as the gate electrode 14 and is formed by the same process as the gate electrode 14.

An NMOSFET (negative-channel metal oxide semiconductor field effect transistor) made up of the source region 21, the drain region 22, the gate electrode 23, etc., is thereby provided in the NMOS region 16.

In the PMOS region 17, an n-type N well region 24 is formed in a top layer portion of the semiconductor layer 3. Also, an n-type high concentration impurity region 25 having a higher n-type impurity concentration than the N well region 24 is formed below the N well region 24. The high concentration impurity region 25 has substantially the same size as the N well region 24 in plan view and is formed across the semiconductor substrate 2 and the semiconductor layer 3.

A p-type source region 26 and a p-type drain region 27 are formed in a top layer portion of the N well region 24 and are spaced apart from each other.

A region between the source region 26 and the drain region 27 is a channel region, and on a top surface of the channel region, a gate electrode 28 is formed across an unillustrated gate insulating film. The gate electrode 28 is made of the same material as the gate electrodes 14 and 23 and is formed by the same process as the gate electrodes 14 and 23.

A PMOSFET (positive-channel metal oxide semiconductor field effect transistor) made up of the source region 26, the drain region 27, the gate electrode 28, etc., is thereby provided in the PMOS region 17.

In the Bi region 7, a p-type base region 29 and an n-type collector region 30 are formed in a top layer portion of the semiconductor layer 3 and are spaced apart from each other.

Between the base region 29 and the collector region 30, a LOCOS film 31 is formed in the top surface 3A of the semiconductor layer 3. The LOCOS film 31 is formed by the same process as the LOCOS films 4 and 18 and the field insulating film 13.

An n-type emitter region 32 and a p-type base contact region 33 are formed in a top layer portion of the base region 29 and are spaced apart from each other. A p-type impurity concentration of the base contact region 33 is higher than a p-type impurity concentration of the base region 29.

A collector contact region 34 having a higher n-type impurity concentration than the collector region 30 is formed in a top layer portion of collector region 30.

A bipolar transistor made up of the base region 29, the collector region 30, the emitter region 32, etc., is thereby provided in the Bi region 7.

An n-type impurity region 35 having a higher n-type impurity concentration than the emitter region 32 is formed below the base region 29 and the collector region 30. The n-type impurity region 35 is formed across the semiconductor substrate 2 and the semiconductor layer 3, is connected to a deepest portion of the collector region 30, and extends to a position opposed to the base region 29.

Also, in the semiconductor layer 3, a p-type well region 36 is formed to an annular shape along the LOCOS film 4 below the LOCOS film 4 surrounding the LDMOS region 5.

Further, a low isolation region 37 having a higher p-type impurity concentration than the well region 36 is formed below the well region 36. The low isolation region 37 is formed across the semiconductor substrate 2 and the semiconductor layer 3, is connected to a deepest portion of the well region 36, and extends to a position opposed to the body region 8.

Also, an unillustrated interlayer insulating film is formed above the semiconductor layer 3. A plurality of wirings are formed on the interlayer insulating film. For example, a drain wiring 38 is formed at a position opposed to the drain buffer region 9 across the interlayer insulating layer. The drain wiring 38 is electrically connected to the drain contact region 12 via a plug 39 that penetrates through the interlayer insulating film. The drain wiring 38 is laid out so as to overlap with at least an innermost field plate 15 in plan view. Also, on the interlayer insulating film (not shown), a source wiring 40 is formed at a position opposed to the source region 11 and the body contact region 10 across the interlayer insulating film. The source wiring 40 is electrically connected to the source region 11 and the body contact region 10 via a plug 41 that penetrates through the interlayer insulating film. The source wiring 40 is laid out so as to overlap with at least the integral plate of the gate electrode 14 and the outermost field plate 15.

Figure 3:
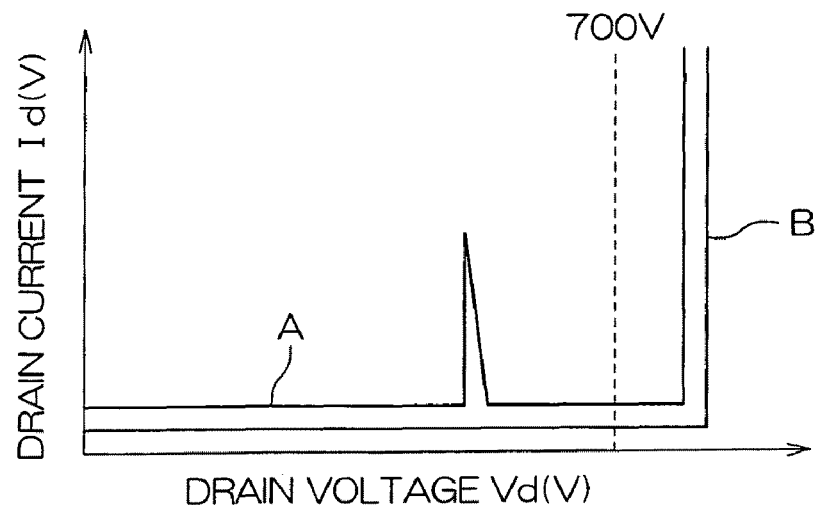
FIG. 3 is a graph of I-V waveforms obtained during device breakdown voltage measurements of LDMOSFETs.

FIG. 3 is a graph of I-V waveforms obtained during device breakdown voltage measurements of LDMOSFETs. In this graph, an abscissa indicates a drain voltage and an ordinate indicates a drain current.

In the process of arriving at the present invention, the present inventor prepared a model with which the field plates 15 are omitted from the semiconductor device 1 shown in FIG. 1, and measured the device breakdown voltage with the source region 11 and the gate electrode 14 in the model being grounded and by applying a drain voltage to the drain buffer region 9 of the LDMOS region 5.

In the model with which the field plates 15 are omitted from the semiconductor device 1, the specific resistance of the semiconductor layer 3 is 2.5Ω·cm, and thus by simulation, a device breakdown voltage exceeding 750V is obtained.

However, when the device breakdown voltage was actually measured by applying the drain voltage, it was found that a leakage current flows instantaneously before the drain voltage reaches 700V and a breakdown phenomenon occurs after the drain voltage exceeds 700V as indicated by waveform A shown in FIG. 3.

Figure 4:
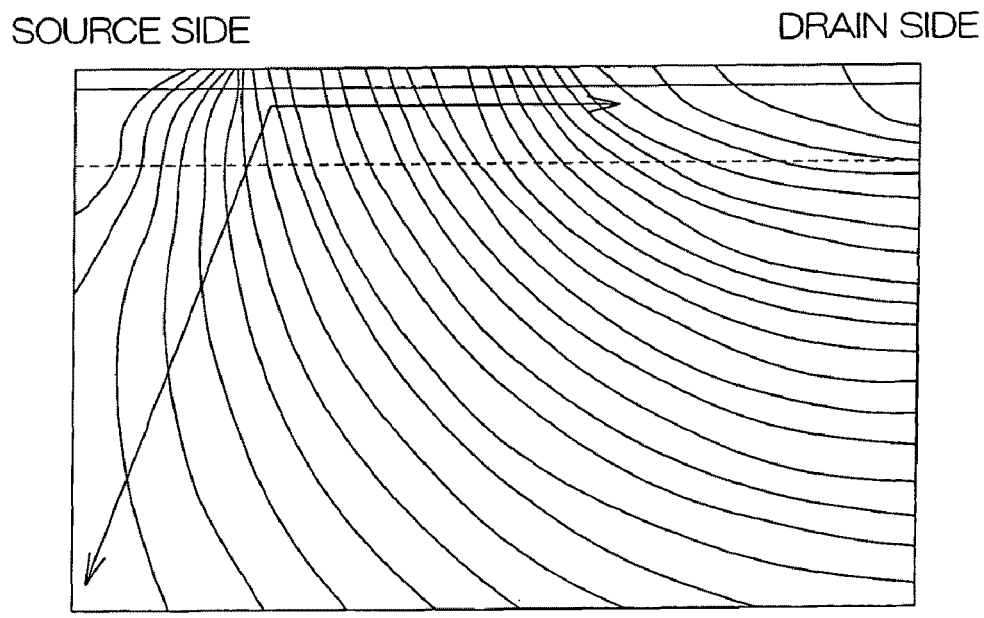
FIG. 4 is an equipotential line diagram showing a potential distribution in a semiconductor layer in the LDMOS region during drain voltage application.
Figure 5:
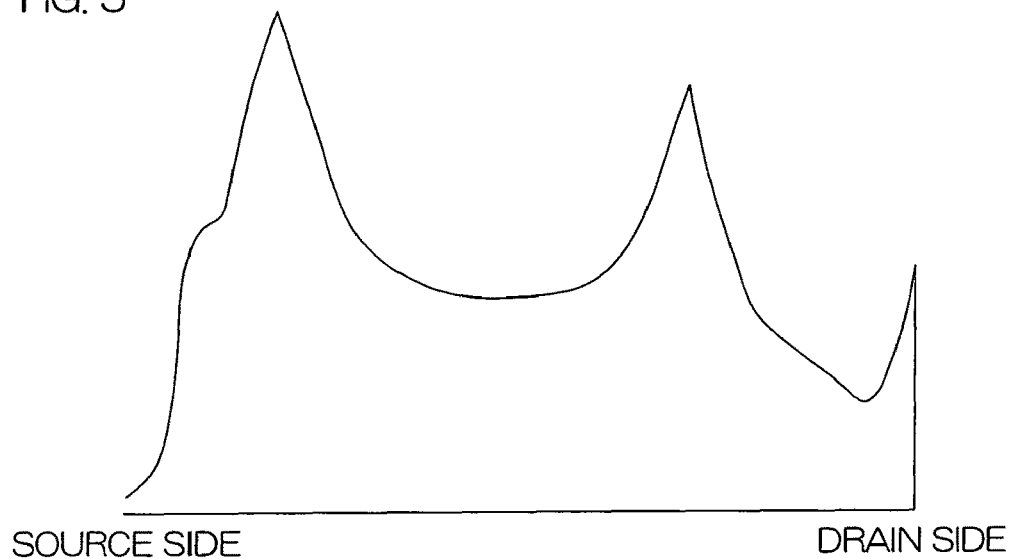
FIG. 5 is a graph of a field strength distribution in the semiconductor layer in the LDMOS region during drain voltage application.

FIG. 4 is an equipotential line diagram showing a potential distribution in the semiconductor layer in the LDMOS region during drain voltage application. FIG. 5 is a graph of a field strength distribution in the semiconductor layer in the LDMOS region during drain voltage application.

When the potential distribution and the field strength distribution in the semiconductor layer 3 in the LDMOS region 5 during drain voltage application were examined and the drain buffer region 9 side and the source region 11 side were compared, it was found that, during the drain voltage application, spacings between equipotential lines are narrower at the source region 11 side (source side) as shown in FIG. 4 and a large electric field concentration occurs at the source region 11 side as shown in FIG. 5.

The electric field concentration at the source region 11 side is considered to be a cause of occurrence of the leakage current, and if the electric field concentration can be alleviated, the device breakdown voltage of the LDMOSFET can be improved.

Figure 6:
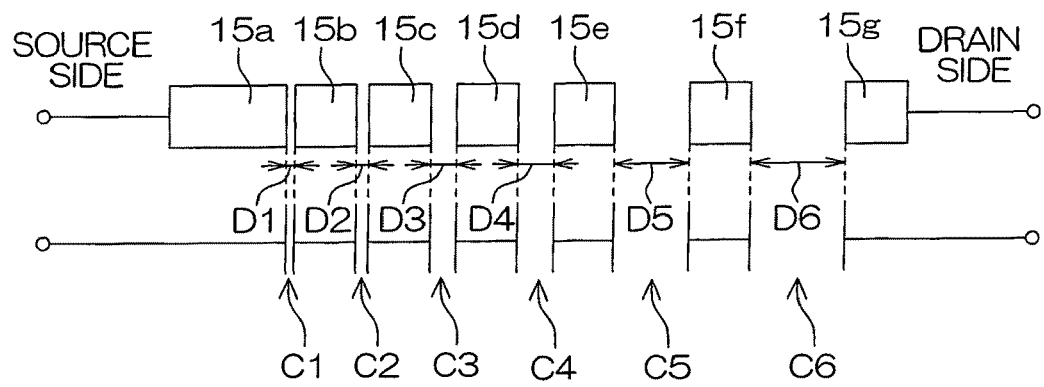
FIG. 6 is a schematic diagram of spacings between field plates.

FIG. 6 is a schematic diagram of spacings between the field plates.

With the seven field plates 15 on the field insulating film 13 in the semiconductor device 1, the spacing between adjacent field plates decreases as the source region 11 side is approached. Specifically, when as shown in FIG. 6, the respective field plates 15 are provided with the reference symbols 15a, 15b, 15c, 15d, 15e, 15f, and 15g in that order from the outermost field plate 15 (the field plate 15 formed integral to the gate electrode 14), the spacing between the field plates 15a and 15b is indicated as the spacing D1, the spacing between the field plates 15b and 15c is indicated as the spacing D2, the spacing between the field plates 15c and 15d is indicated as the spacing D3, the spacing between the field plates 15d and 15e is indicated as the spacing D4, the spacing between the field plates 15e and 15f is indicated as the spacing D5, and the spacing between the field plates 15f and 15g is indicated as the spacing D6, the spacings D1 to D6 are in the relationship:

D1<D2<D3<D4<D5<D6.

A capacitance C1 of a capacitor arranged by the field plates 15a and 15b, a capacitance C2 of a capacitor arranged by the field plates 15b and 15c, a capacitance C3 of a capacitor arranged by the field plates 15c and 15d, a capacitance C4 of a capacitor arranged by the field plates 15d and 15e, a capacitance C5 of a capacitor arranged by the field plates 15e and 15f, and a capacitance C6 of a capacitor arranged by the field plates 15f and 15g are thus in the relationship:

C1>C2>C3>C4>C5>C6.

Consequently, the concentration of electric field at a portion close to the source region 11 of the semiconductor layer 3 can be suppressed, and the occurrence of leakage due to the electric field concentration can be suppressed. The LDMOS-FET can thus be made to have device breakdown characteristics such that a leakage current is not generated at a drain voltage of no more than 700V and breakdown occurs when the drain voltage reaches approximately 750V as illustrated by the waveform B shown in FIG. 3.

Also, with the semiconductor device 1, the drain wiring 38 is laid out so as to overlap with at least the innermost field plate 15 in plan view. Put in another way, at least the innermost field plate 15 is disposed so as to overlap with the drain wiring 38 in plan view. Electric fields formed by the capacitors between the field plates 15 can thereby be prevented from being influenced by the drain wiring 38 (drain voltage) and the electric field concentration suppressing effect by the capacitors between the field plates 15 can be exhibited satisfactorily.

Also, with the semiconductor device 1, the low isolation region 37 is formed to enable the concentration of electric field below the body region 8 to be prevented and further improvement of the device breakdown voltage is achieved.

Also, with the semiconductor device 1, the p-type semiconductor substrate 2, with which the n-type semiconductor layer 3 is provided directly above, is adopted in place of a thick-film SOI substrate. The semiconductor substrate 2 is far more inexpensive than a thick-film SOI substrate. Also, the semiconductor layer can be formed inexpensively and easily, for example, by an epitaxial growth method. Thus, with the semiconductor device 1, cost reduction can be achieved in comparison to a semiconductor device that adopts a thick-film SOI substrate.

Although a preferred embodiment has been described above, the present invention can be put into practice in other modes as well.

For example, a p-type RESURF layer 51 may be formed below the field insulating film 13 in the LDMOS region 5 as indicated by broken lines in FIG. 1. The RESURF layer 51 is favorably formed partially across a portion of the semiconductor layer 3 at which the concentration of electric field occurs readily, that is, a portion close to the source region 11. The concentration of electric field in the semiconductor layer 3 can thereby be suppressed further.

The RESURF layer 51 may also be formed across an entirety of the portion opposed to the field insulating film 13. When in the case where the RESURF layer 51 is formed across the entirety of the portion opposed to the field insulating film 13, the p-type impurity concentration of the RESURF layer 51 is increased, although the device breakdown voltage of the LDMOSFET increases, the on resistance also increases. The concentration of the p-type impurity in the RESURF layer 51 should thus be determined in consideration of a balance between the device breakdown voltage and the on resistance.

The present invention can also be applied to a structure in which the conductivity types (p-type and n-type) of the respective semiconductor portions are inverted with respect to those of the semiconductor device 1.

While preferred embodiments of the present invention have been described in detail above, these are merely specific examples used to clarify the technical contents of the present invention and the present invention should not be interpreted restrictively to these specific examples and the spirit and scope of the present invention is to be determined solely by the following claims.

The present application corresponds to Japanese Patent Application No. 2010-22117 filed in the Japan Patent Office on Feb. 3, 2010, and the entire disclosure of this application is incorporated herein by reference.

What is claimed is:

1. A semiconductor device comprising:
a semiconductor substrate of a first conductivity type having a top surface and a rear surface;
a semiconductor layer of a second conductivity type formed on the top surface of the semiconductor substrate, having a top surface and a rear surface, and having the rear surface in contact with the top surface of the semiconductor substrate;
a body region of the first conductivity type formed in a top layer portion of the semiconductor layer;
a first impurity region of the second conductivity type formed in a top layer portion of the semiconductor layer and spaced apart from the body region;
a second impurity region of the second conductivity type formed in a top layer portion of the body region and spaced apart from a peripheral edge of the body region;
a gate electrode formed on the semiconductor layer and opposed to a portion between the peripheral edge of the body region and a peripheral edge of the second impurity region;
a field insulating film formed in a portion of the top surface of the semiconductor layer between the body region and the first impurity region; and
a plurality of field plates formed on the field insulating film and spaced apart from each other; and
wherein a spacing between adjacent field plates is decreased as the body region is approached from the first impurity region.

2. The semiconductor device according to claim 1, further comprising a RESURF layer of the first conductivity type formed in a portion of the top layer portion of the semiconductor layer opposed to the field insulating film.

3. The semiconductor device according to claim 1, wherein no less than three of the plurality of field plates are formed and spaced apart from each other.

4. The semiconductor device according to claim 1, wherein the plurality of field plates include a plurality of annular plates that differ mutually in length, and
the plurality of annular plates are disposed so that a relatively long annular plate surrounds a relatively short annular plate.

5. The semiconductor device according to claim 4, wherein the gate electrode is formed to an annular shape that is integral to an outermost annular plate.

6. The semiconductor device according to claim 1, further comprising an element isolating portion formed in the top surface of the semiconductor layer and
wherein an LDMOS region, in which the body region and the first impurity region are formed, is insulatingly isolated from a region peripheral to the LDMOS region by the element isolating portion.

7. The semiconductor device according to claim 6, further comprising a bipolar transistor formed in the region that is insulatingly isolated from the LDMOS region by the element isolating portion.

8. The semiconductor device according to claim 6, further comprising a low isolation region of the first conductivity type formed across the semiconductor substrate and the semiconductor layer between a position opposed to the element isolating portion and a position opposed to the body region.

9. The semiconductor device according to claim 1, wherein the body region is formed to an annular shape,
the first impurity region is formed in a region surrounded by the body region, and
the field insulating film is formed to an annular shape with an inner peripheral edge thereof disposed on a peripheral edge of the first impurity region and an outer peripheral edge thereof disposed at a position spaced apart from the body region.

10. The semiconductor device according to claim 7, wherein the bipolar transistor includes a base region of the first conductivity type and a collector region of the second conductivity type formed in the top layer portion of the semiconductor layer and spaced apart from each other, and
an emitter region of the second conductivity type formed in a top layer portion of the base region.

11. The semiconductor device according to claim 10, wherein the semiconductor layer includes a third impurity region of the second conductivity type formed on the rear surface side of the semiconductor layer with respect to the base region and the collector region and having a higher impurity concentration than the emitter region.

12. The semiconductor device according to claim 11, wherein the third impurity region is formed across the semiconductor substrate and the semiconductor layer, is connected to a deepest portion of the collector region, and extends along an interface of the semiconductor substrate and the semiconductor layer to a position opposed to the base region.

13. The semiconductor device according to claim 1, wherein the semiconductor substrate is made from a silicon substrate.

14. The semiconductor device according to claim 1, wherein a specific resistance of the semiconductor layer is 2.5Ω·cm.

15. The semiconductor device according to claim 1, wherein the element isolating portion is made from a silicon oxide film.

* * * * *